(12) United States Patent
Kim et al.

(10) Patent No.: US 8,507,911 B2
(45) Date of Patent: Aug. 13, 2013

(54) THIN FILM TRANSISTOR AND ORGANIC LIGHT EMITTING DISPLAY APPARATUS

(75) Inventors: Eun-Hyun Kim, Yongin (KR);
Jong-Han Jeong, Yongin (KR);
Yeon-Gon Mo, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 302 days.

(21) Appl. No.: 12/943,896

(22) Filed: Nov. 10, 2010

(65) Prior Publication Data

US 2011/0114957 A1    May 19, 2011

(30) Foreign Application Priority Data

Nov. 13, 2009  (KR) .................. 10-2009-0109704

(51) Int. Cl.
*H01L 29/72* (2006.01)
(52) U.S. Cl.
USPC ............... 257/59; 257/55; 257/66; 257/72
(58) Field of Classification Search
USPC .................................. 257/57, 59, 66, 72
See application file for complete search history.

(56) References Cited

U.S. PATENT DOCUMENTS

| | | | |
|---|---|---|---|
| 6,587,169 B1* | 7/2003 | Yamazaki et al. | 349/110 |
| 2001/0053602 A1 | 12/2001 | Lee | |
| 2007/0108899 A1* | 5/2007 | Jung et al. | 313/506 |

FOREIGN PATENT DOCUMENTS

| | | |
|---|---|---|
| KR | 1994-0016564 | 7/1994 |
| KR | 1996-0015806 | 5/1996 |
| KR | 1998-077750 | 11/1998 |
| KR | 1999-0065762 | 8/1999 |
| KR | 2000-0057776 | 9/2000 |
| KR | 10-2001-0065147 | 7/2001 |
| KR | 10-2003-0049307 | 6/2003 |
| KR | 10-2003-0078372 | 10/2003 |

OTHER PUBLICATIONS

KIPO Notice of Allowance dated Jul. 8, 2011, for Korean priority patent application No. 10-2009-0109704, 5 pages.
KIPO Office action dated Mar. 23, 2011, for Korean priority Patent application 10-2009-0109704, noting listed references in this IDS.
US 6,376,863, 04/2002, Yamazaki et al. (withdrawn)

\* cited by examiner

*Primary Examiner* — Edward Wojciechowicz
(74) *Attorney, Agent, or Firm* — Christie, Parker & Hale, LLP

(57) ABSTRACT

A thin film transistor (TFT) and an organic light emitting display apparatus are provided. The TFT includes: a substrate; a gate electrode on the substrate; an active layer insulated from the gate electrode; source/drain electrodes electrically connected to the active layer; a first insulating film on the source/drain electrodes; a light blocking layer on the first insulating film; and a second insulating film on the light blocking layer.

19 Claims, 3 Drawing Sheets

THIN FILM TRANSISTOR AND ORGANIC LIGHT EMITTING DISPLAY APPARATUS

CROSS-REFERENCE TO RELATED PATENT APPLICATION

This application claims priority to and the benefit of Korean Patent Application No. 10-2009-0109704, filed on Nov. 13, 2009, in the Korean Intellectual Property Office, the entire content of which is incorporated herein by reference.

BACKGROUND

1. Field

The following description relates to a thin film transistor (TFT) and an organic light emitting display apparatus.

2. Description of the Related Art

Recently, conventional display apparatuses have been replaced by portable thin, flat display apparatuses. Organic or inorganic light emitting display apparatuses are self-emissive display apparatuses that have a wide viewing angle, excellent contrast, and high response speed and thus have recently been highlighted as next generation thin flat display apparatuses. Also, organic light emitting display apparatuses, in which an emission layer is formed of an organic material, has excellent brightness, operational voltage, and response speed, compared with those of an inorganic light emitting display device, and may realize various colors.

In addition, an active matrix (AM) type organic light emitting display apparatus is highlighted for securing precise pixel control and excellent image quality.

The AM type organic light emitting display apparatus includes a thin film transistor (TFT) that may be easily affected by foreign substances from the outside, such as moisture, oxygen and hydrogen.

Moreover, external light incident upon an active layer included in the TFT may deteriorate the active layer and the electrical characteristics of the TFT.

SUMMARY

Aspects of embodiments of the present invention are directed toward a thin film transistor (TFT) and an organic light emitting display apparatus capable of improving protection capability against contamination from the outside and preventing or reducing the deterioration of electrical characteristics of the organic light emitting display apparatus due to external light.

According to an embodiment of the present invention, there is provided a thin film transistor (TFT) including: a substrate; a gate electrode on the substrate; an active layer insulated from the gate electrode; source/drain electrodes electrically connected to the active layer; a first insulating film on the source/drain electrodes; a light blocking layer on the first insulating film; and a second insulating film on the light blocking layer.

The light blocking layer may include a material selected from the group consisting of a pigment, carbon, and diamond like carbon (DLC).

The pigment may include any one selected from the group consisting of $CoCx$, $Fe_2O_3$, and a Tb-based compound.

The active layer may include Si or an oxide semiconductor.

The light blocking layer may be configured to be larger than the active layer and to cover the active layer.

The light blocking layer may have an index of refraction differing from that of the first insulating layer, the second insulating layer, or both.

According to another embodiment of the present invention, there is provided an organic light emitting display apparatus including: a substrate; a gate electrode on the substrate; an active layer insulated from the gate electrode; source/drain electrodes electrically connected to the active layer; a first insulating film on the source/drain electrodes; a light blocking layer on the first insulating film; a second insulating film on the light blocking layer; a pixel electrode electrically connected to the source/drain electrodes; an intermediate layer on the pixel electrode and comprising an organic emission layer; and an opposite electrode on the intermediate layer.

The light blocking layer may include any a material from the group consisting of a pigment, carbon, and diamond like carbon (DLC).

The pigment may include a material selected from the group consisting of $CoCx$, $Fe_2O_3$, and a Tb-based compound.

The active layer may include Si or an oxide semiconductor.

The light blocking layer may be configured to be larger than the active layer and to cover the active layer.

The organic light emitting display apparatus may further include a planarization film on the source/drain electrodes, wherein the planarization film comprises the first insulating film, the light blocking layer on the first insulating film, the second insulating film on the light blocking layer, and a via hole through which the source/drain electrodes and the pixel electrode electrically contact each other.

The first insulating film, the light blocking layer, and the second insulating film may have boundary lines defining the via hole, and the boundary lines may be parallel with each other.

The light blocking layer may have an index of refraction differing from that of the first insulating layer, the second insulating layer, or both.

According to another embodiment of the present invention, there is provided an organic light emitting display apparatus including: a substrate; a gate electrode on the substrate; an active layer insulated from the gate electrode; source/drain electrodes electrically connected to the active layer; a pixel electrode electrically connected to the source/drain electrodes; a pixel define film on the pixel electrode and comprising an opening; an intermediate layer connected to the pixel electrode through the opening and comprising an organic emission layer; and an opposite electrode on the intermediate layer, wherein the pixel define film comprises a first insulating film, a light blocking layer on the first insulating film, and a second insulating film on the light blocking layer.

The first insulating film, the light blocking layer, and the second insulating film may have boundary lines defining the opening, and the boundary lines may be parallel with each other.

The light blocking layer may include a material selected from the group consisting of a pigment, carbon, and diamond like carbon (DLC).

The pigment may include a material selected from the group consisting of $CoCx$, $Fe_2O_3$, and a Tb-based compound.

The active layer may include Si or an oxide semiconductor.

The light blocking layer may be configured to be larger than the active layer and to cover the active layer.

The light blocking layer may have an index of refraction differing from that of the first insulating layer, the second insulating layer, or both.

BRIEF DESCRIPTION OF THE DRAWINGS

The accompanying drawings, together with the specification, illustrate exemplary embodiments of the present inven

DETAILED DESCRIPTION

Figure 1:
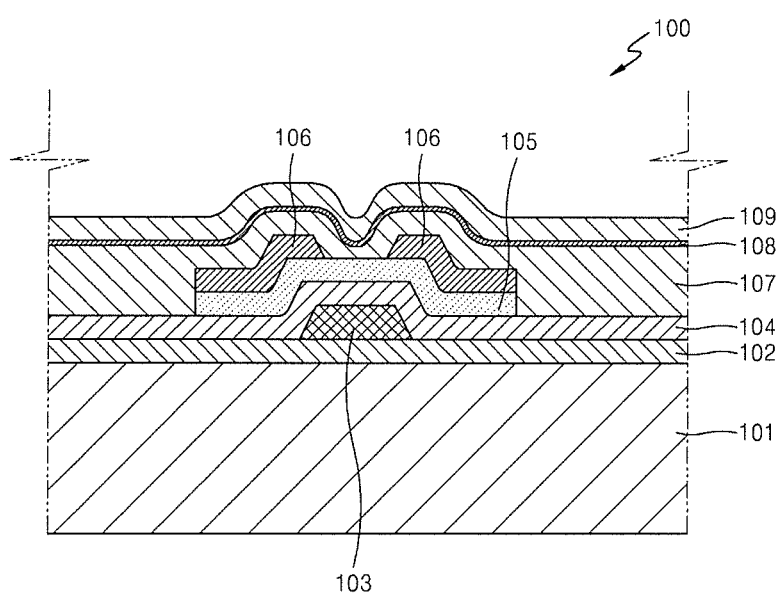
- FIG. 1 is a cross-sectional view of a thin film transistor (TFT) according to an embodiment of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Also, in the context of the present application, when a first element is referred to as being "on" a second element, it can be directly on the second element or be indirectly on the second element with one or more intervening elements interposed therebetween. Like reference numerals designate like elements throughout the specification.

FIG. 1 is a cross-sectional view of a thin film transistor (TFT) 100 according to an embodiment of the present invention.

The TFT 100 according to the current embodiment includes a substrate 101, a gate electrode 103, an active layer 105, source/drain electrodes 106, a first insulating film 107, a light blocking layer 108, and a second insulating film 109.

The substrate 101 may be formed of a transparent glass material including $SiO_2$. The substrate 101 is not limited thereto and may be formed of a transparent plastic material. The transparent plastic material may be an insulating organic material selected from the group consisting of polyethersulphone (PES), polyacrylate (PAR), polyetherimide (PEI), polyethyelenen napthalate (PEN), polyethyelenetrepthalate (PET), polyphenylene sulfide (PPS), polyallylate, polyimide, polycarbonate (PC), cellulose triacetate (TAC), and cellulose acetate propionate (CAP).

Also, the substrate 101 may include carbon, iron, chrome, manganese, nickel, titanium, molybdenum, stainless steel (SUS), an Invar alloy, an Inconel alloy, and/or a Kovar alloy.

A buffer layer 102 may be formed on the substrate 101 in order to form a planarized surface on the substrate 101 and to prevent or reduce impurities from penetrating the substrate 101. The buffer layer 102 may be formed of $SiO_2$ and/or SiNx (e.g. $Si_3N_4$).

The gate electrode 103 is formed on the buffer layer 102. The gate electrode 103 is connected to a gate line via which on/off signals of the TFT 100 are applied. The gate electrode 103 may be formed of a metal selected from the group consisting of gold (Au), silver (Ag), copper (Cu), nickel (Ni), platinum (Pt), palladium (Pd), aluminum (Al), molybdenum (Mo), an Al:Nd alloy, a Mo:W alloy, and alloys of these metals. However, the current embodiment is not limited thereto.

A gate insulating film 104 is formed on the gate electrode 103. The gate insulating film 104 may be formed of an inorganic material such as a metal oxide or a metal nitride, or an organic material such as insulating polymer. Also, the gate insulating film 104 may be formed of $SiO_2$ and/or SiNx.

The active layer 105 is formed on the gate insulating film 104. The active layer 105 may include an oxide semiconductor. When the active layer 105 is formed of an oxide semiconductor, various types of materials including a Zn-based oxide, an In-based oxide, or a Ga-based oxide may be used.

However, the present invention is not limited thereto and the active layer 105 may include amorphous Si or polycrystalline Si.

The source/drain electrodes 106 are formed on the active layer 105. The source/drain electrodes 106 may be formed of Al, Mo, or alloys of at least two metals, such as an Al:Nd alloy or a Mo:W alloy, in addition to Au, Pd, Pt, Ni, rhodium (Rh), ruthenium (Ru), iridium (Ir), and osmium (Os), but the source/drain electrodes are not limited thereto.

Although not illustrated, an ohmic contact layer may be separately interposed between the active layer 105 and the source/drain electrodes 106, in order to improve an ohmic contact characteristic by lowering the contact resistance between the active layer 105 and the source/drain electrodes 106. Also, an etch stopper, which is disposed to cover an area of the active layer 105 that is not covered by the source/drain electrodes 106 and is exposed, may be included.

The first insulating film 107, the light blocking layer 108, and the second insulating film 109 are sequentially formed on the source/drain electrodes 106. The first insulating film 107, the light blocking layer 108, and the second insulating film 109 protect the gate electrode 103, the active layer 105, and the source/drain electrodes 106 from foreign substances or moisture. In particular, the light blocking layer 108 prevents or reduces the penetration of external light.

The first insulating film 107 may be an inorganic insulating film or an organic insulating film. When the first insulating film 107 includes an inorganic insulating film, the first insulating film 107 may include $SiO_2$, SiNx, SiON, $Al_2O_3$, $TiO_2$, $Ta_2O_5$, $HfO_2$, $ZrO_2$, BST, and/or PZT. When the first insulating film 107 includes an organic insulating film, the first insulating film 107 may include a commercial polymer (polymethyl methacrylate (PMMA) and/or Polystyrene (PS)), a polymer derivative having a phenol group, an acrylic-based polymer, an imide-based polymer, an arylether-based polymer, an amide-based polymer, a fluorinated polymer, a p-xylene-based polymer, a vinyl alcohol-based polymer, or blends thereof.

The light blocking layer 108 is formed on the first insulating film 107 and may include a pigment so as to prevent or reduce the penetration of external light. More specifically, the light blocking layer 108 may include CoCx, Fe2O3, and/or a Tb-based compound. Also, the light blocking layer 108 may also include carbon and/or diamond like carbon (DLC) so as to have a black color.

The light blocking layer 108 blocks external light from being incident to the active layer 105 so as to prevent or reduce the active layer 105 from being deteriorated by the external light. In particular, when the active layer 105 is an oxide semiconductor layer, the active layer 105 may be seriously damaged by external light; however, the embodiment of the present invention may prevent or reduce such a problem due to the light blocking layer 108.

The second insulating film 109 is formed on the light blocking layer 108. The second insulating film 109 may be an inorganic insulating film and/or an organic insulating film. When the second insulating film 109 includes an inorganic insulating film, the second insulating film 109 may include $SiO_2$, SiNx, SiON, $Al_2O_3$, $TiO_2$, $Ta_2O_5$, $HfO_2$, $ZrO_2$, BST, or PZT. When the second insulating film 109 includes an organic insulating film, the second insulating film 109 may include a commercial polymer (polymethyl methacrylate (PMMA) and/or Polystyrene (PS)), a polymer derivative having a phenol group, an acrylic-based polymer, an imide-based polymer, an arylether-based polymer, an amide-based polymer, a fluorinated polymer, a p-xylene-based polymer, a vinyl alcohol-based polymer, or blends thereof. The first insulating film 107 and the second insulating film 109 may be formed of the same material.

The TFT 100 according to the current embodiment includes the first insulating film 107, the light blocking layer 108, and the second insulating film 109 that are sequentially formed on the source/drain electrodes 106 so as to prevent or inhibit foreign substances and moisture from penetrating thereto.

Also, the light blocking layer 108 blocks external light from being incident to the gate electrode 103, the active layer 105, and the source/drain electrodes 106 so as to prevent or reduce the gate electrode 103, the active layer 105, and the source/drain electrodes 106 from being damaged by the external light. In particular, the light blocking layer 108 prevents or inhibits external light from being incident to the active layer 105, which is easily deteriorated by external light, and thus improves the electric characteristics of the TFT 100.

In addition, the light blocking layer 108 is interposed between the first insulating film 107 and the second insulating film 109, wherein the first insulating film 107 and the second insulating film 109, which are disposed on upper and lower parts of the light blocking layer 108, respectively, have refractive indexes that are different from that of the light blocking layer 108. Due to the differences in the refractive indexes, external light may not penetrate and external light may be prevented from being reflected.

In the current embodiment, a bottom gate structure is only illustrated. However, the present invention is not limited thereto and a top gate structure may also be formed.

Figure 2:
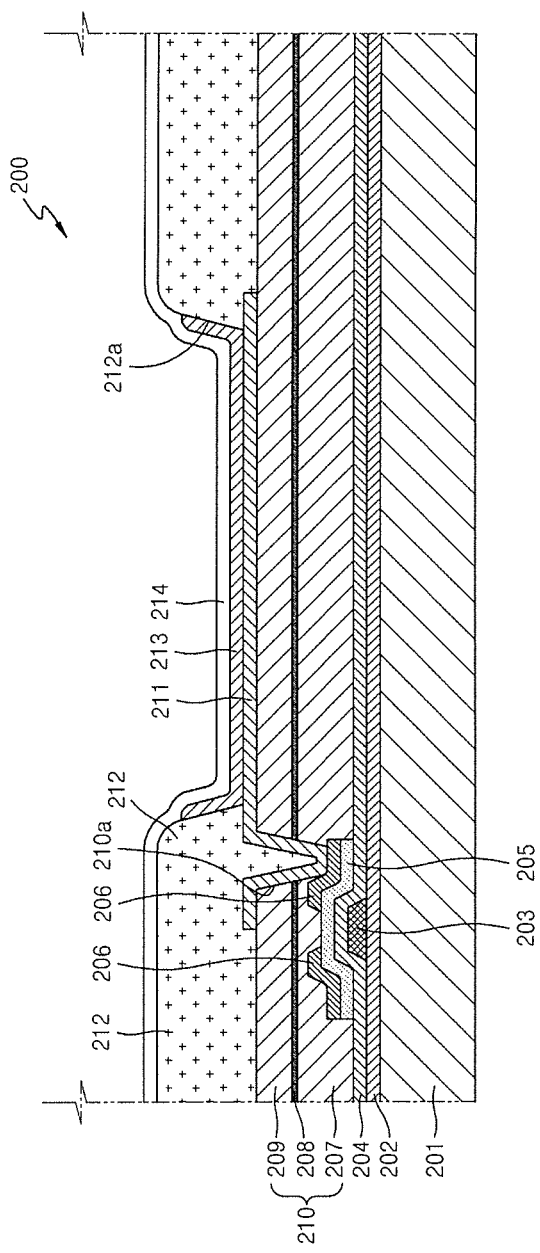
FIG. 2 is a cross-sectional view of an organic light emitting display apparatus according to an embodiment of the present invention.

FIG. 2 is a cross-sectional view of an organic light emitting display apparatus 200 according to an embodiment of the present invention.

The organic light emitting display apparatus 200 according to the current embodiment includes a substrate 201, a gate electrode 203, an active layer 205, source/drain electrodes 206, a first insulating film 207, a light blocking layer 208, a second insulating film 209, a pixel electrode 211, an intermediate layer 213, and an opposite electrode 214.

The substrate 201 may be formed of a transparent glass material including $SiO_2$. The substrate 201 is not limited thereto and may be formed of a transparent plastic material. The transparent plastic material may be an insulating organic material selected from the group consisting of polyethersulphone (PES), polyacrylate (PAR), polyetherimide (PEI), polyethyelenen napthalate (PEN), polyethyeleneterepthalate (PET), polyphenylene sulfide (PPS), polyallylate, polyimide, polycarbonate (PC), cellulose triacetate (TAC), and cellulose acetate propionate (CAP).

When the organic light emitting display apparatus 200 is a bottom emission type in which an image is formed by directly imaging light toward the substrate 201, the substrate 201 may be formed of a transparent material. When the organic light emitting display apparatus 200 is a top emission type in which an image is formed by directly imaging light away from the substrate 201, the substrate 201 may be formed of a metal, not of a transparent material. When the substrate 201 is formed of a metal, the metal may include at least one selected from the group consisting of carbon, iron, chrome, manganese, nickel, titanium, molybdenum, stainless steel (SUS), an Invar alloy, an Inconel alloy, and a Kovar alloy. However, the current embodiment is not limited thereto and the substrate 201 may be formed of a metal foil.

A buffer layer 202 may be formed on the substrate 201 in order to form a planarized surface on the substrate 201 and to prevent or inhibit impurities from penetrating the substrate 201. The buffer layer 202 may be formed of $SiO_2$ and/or SiNx.

The gate electrode 203 is formed on the buffer layer 202. The gate electrode 203 is connected to a gate line via which on/off signals of a TFT are applied. The gate electrode 203 may be formed of a metal such as gold (Au), silver (Ag), copper (Cu), nickel (Ni), platinum (Pt), palladium (Pd), aluminum (Al), molybdenum (Mo), an Al:Nd alloy, a Mo:W alloy, and alloys of these metals. However, the current embodiment is not limited thereto.

A gate insulating film 204 is formed on the gate electrode 203. The gate insulating film 204 may be formed of an inorganic material such as a metal oxide or a metal nitride, or an organic material such as insulating polymer. Also, the gate insulating film 204 may be formed of $SiO_2$ and/or SiNx.

The active layer 205 is formed on the gate insulating film 204. The active layer 205 may include an oxide semiconductor. When the active layer 205 is formed of an oxide semiconductor, various types of materials including a Zn-based oxide, an In-based oxide, or a Ga-based oxide may be used.

However, the present invention is not limited thereto and the active layer 205 may include amorphous Si or polycrystalline Si.

The source/drain electrodes 206 are formed on the active layer 205. The source/drain electrodes 206 may be formed of Al, Mo, or alloys of at least two metals, such as an Al:Nd alloy or a Mo:W alloy, in addition to Au, Pd, Pt, Ni, Rh, Ru, Ir, and Os, but are not limited thereto.

Although not illustrated, an ohmic contact layer may be separately interposed between the active layer 205 and the source/drain electrodes 206, in order to improve an ohmic contact characteristic by lowering contact resistance between the active layer 205 and the source/drain electrodes 206. Also, an etch stopper, which is disposed to cover an area of the active layer 205 that is not covered by the source/drain electrodes 206 and is exposed, may be included.

A planarization film 210 is formed on the source/drain electrodes 206. The planarization film 210 includes the first insulating film 207, the light blocking layer 208, and the second insulating film 209 that are sequentially stacked. The first insulating film 207, the light blocking layer 208, and the second insulating film 209 protect the gate electrode 203, the active layer 205, and the source/drain electrodes 206 from foreign substances or moisture. In particular, the light blocking layer 208 prevents or reduces the penetration of external light.

The first insulating film 207 may be an inorganic insulating film or an organic insulating film. When the first insulating film 207 includes an inorganic insulating film, the first insulating film 207 may include $SiO_2$, SiNx, SiON, $Al_2O_3$, $TiO_2$, $Ta_2O_5$, $HfO_2$, $ZrO_2$, BST, and/or PZT. When the first insulating film 207 includes an organic insulating film, the first insulating film 207 may include a commercial polymer (polymethyl methacrylate (PMMA) and/or Polystyrene (PS)), a polymer derivative having a phenol group, an acrylic-based polymer, an imide-based polymer, an arylether-based polymer, an amide-based polymer, a fluorinated polymer, a p-xylene-based polymer, a vinyl alcohol-based polymer, or blends thereof.

The light blocking layer 208 is formed on the first insulating film 207 and may include a pigment so as to prevent or reduce the penetration of external light. More specifically, the light blocking layer 208 may include $CoCx$, $Fe_2O_3$, and/or a Tb-based compound. Also, the light blocking layer 208 may also include carbon and/or DLC so as to have a black color.

The light blocking layer 208 blocks external light from being incident to the active layer 205 so as to prevent or inhibit the active layer 205 from being deteriorated by the external light. In particular, when the active layer 205 is an oxide semiconductor layer, the active layer 205 may be seriously damaged by external light; however, the present invention may prevent or reduce such a problem due to the light blocking layer 208.

The second insulating film 209 is formed on the light blocking layer 208. The second insulating film 209 may be an inorganic insulating film and/or an organic insulating film. When the second insulating film 209 includes an inorganic insulating film, the second insulating film 209 may include $SiO_2$, SiNx, SiON, $Al_2O_3$, $TiO_2$, $Ta_2O_5$, $HfO_2$, $ZrO_2$, BST, and/or PZT. When the second insulating film 209 includes an organic insulating film, the second insulating film 209 may include a commercial polymer (polymethyl methacrylate (PMMA) and/or Polystyrene (PS)), a polymer derivative having a phenol group, an acrylic-based polymer, an imide-based polymer, an arylether-based polymer, an amide-based polymer, a fluorinated polymer, a p-xylene-based polymer, a vinyl alcohol-based polymer, or blends thereof. The first insulating film 207 and the second insulating film 209 may be formed of the same material.

The planarization film 210 has a via hole 210a. The via hole 210a is formed in the planarization film 210 to expose one of the source/drain electrodes 206. In order to form the via hole 210a, the first insulating film 207, the light blocking layer 208, and the second insulating film 209 are sequentially stacked and a photolithography process using one mask may be performed thereto. Accordingly, the first insulating film 207, light blocking layer 208, and the second insulating film 209 may have boundary lines defining the via hole 210a and the boundary lines may be parallel with (or flush with) each other using a simple process.

The pixel electrode 211 is formed on the planarization film 210. The pixel electrode 211 may be a transparent electrode or a reflective electrode. When the pixel electrode 211 is a transparent electrode, the pixel electrode 211 may include ITO, IZO, ZnO, and/or $In_2O_3$. When the pixel electrode 211 is a reflective electrode, the pixel electrode 211 may be formed by forming a reflective film by using Ag, Mg, Al, Pt, Pd, Au, Ni, Nd, Ir, Cr, or a compound thereof and then forming a film on the reflective film by using ITO, IZO, ZnO, and/or $In_2O_3$. The pixel electrode 211 contacts any one of the source/drain electrodes 20 through the via hole 210a.

A pixel define film 212 is formed on the planarization film 210, and covers the pixel electrode 211. The pixel define film 212 may be formed of an organic material and/or an inorganic material. The pixel define film 212 has an opening 212a that exposes the pixel electrode 211.

The intermediate layer 213 is formed in the opening 212a so as to contact the pixel electrode 211. The intermediate layer 213 includes an organic emission layer.

The intermediate layer 213 emits light by electric operation of the pixel electrode 211 and the opposite electrode 214.

The intermediate layer 213 is formed of an organic material. When the organic emission layer of the intermediate layer 213 is formed of a low molecular weight organic material, a hole transport layer (HTL) and a hole injection layer (HIL) are disposed between the pixel electrode 211 and the organic emission layer, and an electron transport layer (ETL) and an electron injection layer (EIL) are disposed between the opposite electrode 214 and the organic emission layer. In addition, various other layers may be included in the intermediate layer 213, if necessary. The organic material for forming the intermediate layer 213 may include copper phthalocyanine (CuPc), N,N'-Di(naphthalene-1-yl)-N,N'-diphenyl-benzidine (NPB), and/or tris-8-hydroxyquinoline aluminum)(Alq3).

Moreover, when the organic emission layer of the intermediate layer 213 is formed of a polymer organic material, a HTL may be only formed between the pixel electrode 211 and the organic emission layer. The HTL is formed on the pixel electrode 211 by inkjet printing and/or spin coating using poly-(2,4)-ethylene-dihydroxy thiophene (PEDOT) and/or polyaniline (PANI). The polymer organic emission layer may be formed of PPV, Soluble PPV's, Cyano-PPV, and/or polyfluorene; and a color pattern may be formed by using a suitable method such as inkjet printing, spin coating, and/or thermal printing using a laser.

The opposite electrode 214 is formed on the intermediate layer 213. The opposite electrode 214 may be formed by depositing a metal having a small work function, such as Ag, Mg, Al, Pt, Pd, Au, Ni, Nd, Ir, Cr, Li, Ca, or compounds thereof and then depositing a transparent conductive material such as ITO, IZO, ZnO, or $In_2O_3$ on the metal.

A sealing member may be formed on the opposite electrode 214. The sealing member is formed to protect the intermediate layer 213 and the other layers from outside moisture or oxygen and is formed of a transparent material. Accordingly, the sealing member may be formed of plastic or may have a structure in which an organic material and an inorganic material are stacked upon one another.

The organic light emitting display apparatus 200 according to the current embodiment includes the planarization film 210, in which the first insulating film 207, the light blocking layer 208, and the second insulating film 209 are sequentially stacked on the source/drain electrodes 206, so as to prevent or inhibit foreign substances and moisture from penetrating thereto.

Also, the light blocking layer 208 blocks external light from being incident to the gate electrode 203, the active layer 205, and the source/drain electrodes 206 so as to prevent or inhibit the gate electrode 203, the active layer 205, and the source/drain electrodes 206 from being damaged by the external light. In particular, the light blocking layer 208 prevents or inhibits external light from being incident to the active layer 205, which is easily deteriorated by external light, and thus, improves the electric characteristics of the organic light emitting display apparatus 200.

In addition, the light blocking layer 208 is interposed between the first insulating film 207 and the second insulating film 209, wherein the first insulating film 207 and the second insulating film 209 below and above the light blocking layer 208, respectively, have refractive indexes that are different from the light blocking layer 208. Because the refractive indexes of the first insulating film 207 and the second insulating film 209 are different from that of the light blocking layer 208, external light may not penetrate and external light may be prevented from being reflected. In the current embodiment, a bottom gate structure is only illustrated. However, the present invention is not limited thereto and a top gate structure may also be formed.

Figure 3:
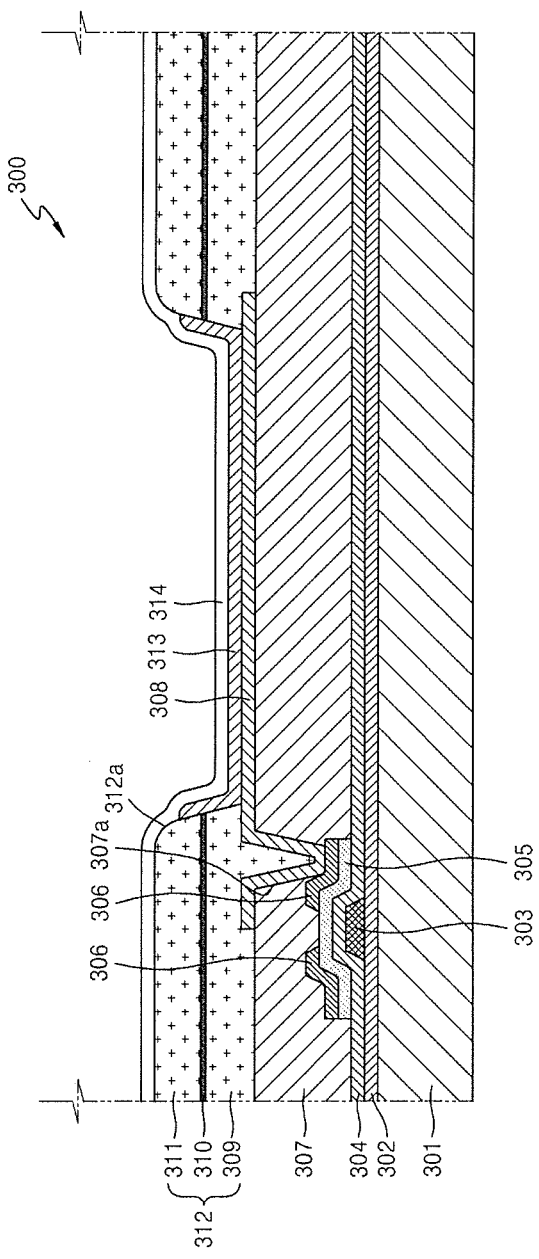
FIG. 3 is a cross-sectional view of an organic light emitting display apparatus according to another embodiment of the present invention.

FIG. 3 is a cross-sectional view of an organic light emitting display apparatus 300 according to another embodiment of the present invention The organic light emitting display apparatus 300 includes a substrate 301, a gate electrode 303, an active layer 305, source/drain electrodes 306, a first insulating film 309, a light blocking layer 310, a second insulating film 311, a pixel electrode 308, an intermediate layer 313, and an opposite electrode 314.

The organic light emitting display apparatus 300 is similar to the organic light emitting display apparatus 200 of FIG. 1 and thus the same description of the same elements will not be repeated for convenience of description.

A buffer layer 302 is formed on the substrate 301 and the gate electrode 303 is formed on the buffer layer 302.

A gate insulating film 304 is formed on the gate electrode 303, and the active layer 305 is formed on the gate insulating film 304. The source/drain electrodes 306 are formed on the active layer 305. Similar to the previous embodiment illustrated in FIG. 2, an ohmic contact layer may be interposed between the active layer 305 and the source/drain electrodes 306 and an etch stopper may be included to cover an area of the active layer 305 that is not covered by the source/drain electrodes 306 and is exposed.

A planarization film 307 is formed on the source/drain electrodes 306. The planarization film 307 may be an inorganic insulating film and/or an organic insulating film. When the planarization film 307 includes the inorganic insulating film, the planarization film 307 may include $SiO_2$, SiNx, SiON, $Al_2O_3$, $TiO_2$, $Ta_2O_5$, $HfO_2$, $ZrO_2$, BST, and/or PZT. When the planarization film 307 includes an organic insulating film, the planarization film 307 may include a commercial polymer (polymethyl methacrylate (PMMA) and/or Polystyrene (PS)), a polymer derivative having a phenol group, an acrylic-based polymer, an imide-based polymer, an arylether-based polymer, an amide-based polymer, a fluorinated polymer, a p-xylene-based polymer, a vinyl alcohol-based polymer, or blends thereof. The planarization film 307 has a via hole 307a.

The pixel electrode 308 is formed on the planarization film 307. The pixel electrode 308 contacts any one of the source/drain electrodes 306 through the via hole 307a.

A pixel define film 312 is formed on the pixel electrode 308. The pixel define film 312 has an opening 312a that exposes the pixel electrode 308.

The pixel define film 312 is formed by sequentially stacking the first insulating film 309, the light blocking layer 310, and the second insulating film 311.

The first insulating film 309 may be an inorganic insulating film and/or an organic insulating film. The light blocking layer 310 is formed on the first insulating film 309 and may include a pigment so as to prevent or inhibit the penetration of external light. More specifically, the light blocking layer 310 may include CoCx, $Fe_2O_3$, and/or a Tb-based compound. Also, the light blocking layer 310 may also include carbon and/or DLC so as to have a black color.

The light blocking layer 310 blocks external light from being incident to the active layer 305 so as to prevent or inhibit the active layer 305 from being deteriorated by the external light. In particular, when the active layer 305 is an oxide semiconductor layer, the active layer 305 may be seriously damaged by external light; however, the present invention may prevent or reduce such a problem due to the light blocking layer 310.

The second insulating film 311 is formed on the light blocking layer 310. The second insulating film 311 may be an inorganic insulating film and/or an organic insulating film.

The pixel define film 312 has an opening 312a that exposes the pixel electrode 308. In order to form the opening 312a, the first insulating film 309, the light blocking layer 310, and the second insulating film 311 are sequentially stacked, and a photolithography process using one mask may be performed thereto. Accordingly, the first insulating film 309, the light blocking layer 310, and the second insulating film 311 may have boundary lines defining the opening 312a and the boundary lines may be parallel with (or flush with) each other using a simple process.

The intermediate layer 313 is formed in the opening 312a so as to contact the pixel electrode 311. The intermediate layer 313 includes an organic emission layer.

The opposite electrode 314 is formed on the intermediate layer 313. A sealing member may be formed on the opposite electrode 314. The sealing member is formed to protect the intermediate layer 313 and the other layers from outside moisture or oxygen and is formed of a transparent material.

The organic light emitting display apparatus 300 according to the current embodiment includes the pixel define film 312, in which the first insulating film 309, the light blocking layer 310, and the second insulating film 311 are sequentially stacked on the source/drain electrodes 306 and the pixel electrode 308, so as to prevent or inhibit foreign substances and moisture from penetrating thereto.

Also, the light blocking layer 310 blocks external light from being incident to the gate electrode 303, the active layer 305, and the source/drain electrodes 306 so as to prevent or inhibit the gate electrode 303, the active layer 305, and the source/drain electrodes 306 from being damaged by the external light. In particular, the light blocking layer 310 prevents or inhibits external light from being incident to the active layer 305, which is easily deteriorated by external light, and prevents or inhibits the active layer 305 from being damaged so as to improve electric characteristics and emission characteristics of the organic light emitting display apparatus 300.

In addition, the light blocking layer 310 is interposed between the first insulating film 309 and the second insulating film 311, wherein the first insulating film 309 and the second insulating film 311 below and above the light blocking layer 310, respectively, have refractive indexes that are different from the light blocking layer 310. Because the refractive indexes of the first insulating film 309 and the second insulating film 311 different from that of the light blocking layer 310, external light may not penetrate and external light may be prevented from being reflected.

In the current embodiment, a bottom gate structure is only illustrated. However, the present invention is not limited thereto and a top gate structure may also be formed.

A TFT and an organic light emitting display apparatus according to the present invention may have improved protection capability against contamination from the outside and prevent or reduce the deterioration of electrical characteristics of the organic light emitting display apparatus due to external light.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A thin film transistor (TFT) comprising:
a substrate;
a gate electrode on the substrate;
an active layer insulated from the gate electrode;
source/drain electrodes electrically connected to the active layer;
a first insulating film on the source/drain electrodes;
a light blocking layer on the first insulating film and comprising a pigment comprising a material selected from the group consisting of CoCx, $Fe_2O_3$, and a Tb-based compound; and
a second insulating film on the light blocking layer.

2. The TFT of claim 1, wherein the active layer comprises Si or an oxide semiconductor.

3. The TFT of claim 1, wherein the light blocking layer is configured to be larger than the active layer and to cover the active layer.

4. The TFT of claim 1, wherein the light blocking layer has an index of refraction differing from that of the first insulating layer, the second insulating layer, or both.

5. An organic light emitting display apparatus comprising:
a substrate;
a gate electrode on the substrate;
an active layer insulated from the gate electrode;
source/drain electrodes electrically connected to the active layer;
a first insulating film on the source/drain electrodes;
a light blocking layer on the first insulating film and having a via hole formed in the light blocking layer;
a second insulating film on the light blocking layer;
a pixel electrode electrically connected to the source/drain electrodes through the via hole of the light blocking layer;
an intermediate layer on the pixel electrode and comprising an organic emission layer; and
an opposite electrode on the intermediate layer.

6. The organic light emitting display apparatus of claim 5, wherein the light blocking layer comprises a material selected from the group consisting of a pigment, carbon, and diamond like carbon (DLC).

7. The organic light emitting display apparatus of claim 6, wherein the pigment comprises a material selected from the group consisting of CoCx, $Fe_2O_3$, and a Tb-based compound.

8. The organic light emitting display apparatus of claim 5, wherein the active layer comprises Si or an oxide semiconductor.

9. The organic light emitting display apparatus of claim 5, wherein the light blocking layer is configured to be larger than the active layer and to cover the active layer.

10. The organic light emitting display apparatus of claim 5, further comprising a planarization film on the source/drain electrodes, wherein the planarization film comprises the first insulating film, the light blocking layer on the first insulating film, the second insulating film on the light blocking layer, and a via hole through which the source/drain electrodes and the pixel electrode electrically contact each other.

11. The organic light emitting display apparatus of claim 10, wherein the first insulating film, the light blocking layer, and the second insulating film have boundary lines defining the via hole, and the boundary lines are parallel with each other.

12. The organic light emitting display apparatus of claim 5, wherein the light blocking layer has an index of refraction differing from that of the first insulating layer, the second insulating layer, or both.

13. An organic light emitting display apparatus comprising:
a substrate;
a gate electrode on the substrate;
an active layer insulated from the gate electrode;
source/drain electrodes electrically connected to the active layer;
a pixel electrode electrically connected to the source/drain electrodes;
a pixel define film on the pixel electrode and comprising an opening;
an intermediate layer connected to the pixel electrode through the opening and comprising an organic emission layer; and
an opposite electrode on the intermediate layer, wherein the pixel define film comprises a first insulating film, a light blocking layer on the first insulating film, and a second insulating film on the light blocking layer.

14. The organic light emitting display apparatus of claim 13, wherein the first insulating film, the light blocking layer, and the second insulating film have boundary lines defining the opening, and the boundary lines are parallel with each other.

15. The organic light emitting display apparatus of claim 13, wherein the light blocking layer comprises a material selected from the group consisting of a pigment, carbon, and diamond like carbon (DLC).

16. The organic light emitting display apparatus of claim 15, wherein the pigment comprises a material selected from the group consisting of CoCx, $Fe_2O_3$, and a Tb-based compound.

17. The organic light emitting display apparatus of claim 13, wherein the active layer comprises Si or an oxide semiconductor.

18. The organic light emitting display apparatus of claim 13, wherein the light blocking layer is configured to be larger than the active layer and to cover the active layer.

19. The organic light emitting display apparatus of claim 13, wherein the light blocking layer has an index of refraction differing from that of the first insulating layer, the second insulating layer, or both.

* * * * *

UNITED STATES PATENT AND TRADEMARK OFFICE
CERTIFICATE OF CORRECTION

| | |
|---|---|
| PATENT NO. | : 8,507,911 B2 |
| APPLICATION NO. | : 12/943896 |
| DATED | : August 13, 2013 |
| INVENTOR(S) | : Eun-Hyun Kim et al. |

It is certified that error appears in the above-identified patent and that said Letters Patent is hereby corrected as shown below:

On the Title Page

(56) References Cited,
Other Publications, line 5     Delete "US 6,376,863, 04/2002, Yamazaki et al. (withdrawn)"

(56) References Cited,
U.S. Patent Documents     Insert -- 6,376,863 B1 4/2002 Yamazaki et al. --

Signed and Sealed this
Thirteenth Day of January, 2015

Michelle K. Lee
*Deputy Director of the United States Patent and Trademark Office*